United States Patent [19]

Slamowitz et al.

[11] Patent Number: 5,043,939

[45] Date of Patent: Aug. 27, 1991

[54] SOFT ERROR IMMUNE MEMORY

[75] Inventors: Mark N. Slamowitz, Aloha; Robert B. Lefferts, Portland, both of Oreg.

[73] Assignee: Bipolar Integrated Technology, Inc., Beaverton, Oreg.

[21] Appl. No.: 366,737

[22] Filed: Jun. 15, 1989

[51] Int. Cl.$^5$ .................................. G11C 11/00
[52] U.S. Cl. .................................. 365/154; 365/155; 365/150; 365/179; 365/272; 307/272.2; 307/279; 307/291; 307/443
[58] Field of Search ............... 365/154, 155, 150, 179, 365/222; 307/443, 296.4, 272.2, 279, , 308, 291

[56] References Cited

U.S. PATENT DOCUMENTS

| | | | |
|---|---|---|---|
| 3,582,673 | 6/1971 | Clayson et al. ............ | 307/296.4 |
| 4,151,484 | 4/1979 | Robe ........................... | 307/308 |
| 4,679,171 | 7/1987 | Logwood et al. ............ | 365/154 |
| 4,725,979 | 2/1988 | Haberman .................. | 365/179 |
| 4,755,693 | 7/1988 | Suzuki et al. ................ | 307/308 |
| 4,782,467 | 11/1988 | Belt et al. ................... | 307/279 |
| 4,785,200 | 11/1988 | Huntington ................ | 307/279 |
| 4,810,900 | 3/1989 | Okabe ........................ | 307/308 |
| 4,864,539 | 9/1989 | Chuang et al. ............. | 365/179 |
| 4,874,966 | 10/1089 | Gehrt et al. ................ | 307/291 |
| 4,891,531 | 1/1990 | Kogayashi et al. ......... | 307/308 |

OTHER PUBLICATIONS

Zhang, Xiaonan and McCall, David, "Current Modeling of Alpha-Particle Induced Soft Errors in Bipolar Memories," Proceedings of the 1987 Bipolar Circuits and Technology Meeting, Sponsored by IEEE.
Motorola Inc., MECL System Design Handbook, Diagram of a Flip-Flop Circuit, p. 13 (1983).
Rose, Bruce W., "A Sub 10 ns Bipolar 5 Port 1 Kbit Register File," Proceedings of the 1986 Bipolar Circuits and Technology Meeting, Sponsored by IEEE, Sep. 11–12, 1986.
M. Okabe, et al., "Design for Reducing Alpha-Particle-Induced Soft Errors in ECL Logic Circuitry," IEEE Jrnl of Solid State Cicts, vol. 24 No. 5, Oct. '89.
M. Okabe, et al., "Tham 12.5: An ECL Gate Array Hardened Against Soft Errors," IEEE ISSOC 87, Feb. 26, 1987.

Primary Examiner—Joseph E. Clawson
Attorney, Agent, or Firm—Marger Johnson McCollom & Stolowitz

[57] ABSTRACT

An alpha radiation immune integrated circuit memory cell has a pair of secondary transistors connected to cross-couple the primary transistors to form a flow, secondary storage node. The secondary transistors are biased to a standby current that, in combiantion with the parasitic capacitances in the new cell, establishes a time constant sufficient to maintain the state of the secondary nodes during an alpha hit on the primary nodes, so that alpha immunity is ahcieved without added capacitance. A write boost circuit increases the current in the secondary transistors during a write operation. A memory array is formed of rows of such cells with all of the secondary emitters of each row coupled to a common emitter standby current source. The individual row emitter standby current sources are coupled together through a balanced resistor network so that the excess secondary emitter current generated during a write operation in a selected row is distributed across the non-selected rows, thereby maintaining the total secondary emitter current constant for the array.

21 Claims, 9 Drawing Sheets

SOFT ERROR IMMUNE MEMORY

BACKGROUND OF THE INVENTION

The present invention relates to the field of integrated circuit memories and, in particular, to alpha radiation soft-error immune memories.

Alpha radiation can cause "soft" or random errors in integrated circuit memories An alpha "hit" generates an instantaneous current pulse in a memory cell that can cause the cell to change state. A model of current generated by an alpha hit is described in "Current Modeling of Alpha-particle Induced Soft Errors in Bipolar Memories" by Zhang and McCall (Proceedings of the 1987 Bipolar Circuits and Technology Meeting, pp 168). This problem exists across various integrated circuit technologies including bipolar and field effect transistor (FET) technologies.

An alpha-induced current of even very short duration can be sufficient to switch the state of a memory cell. To prevent loss of state due to an alpha event, the most common approaches have been to add a large storage node capacitance, to add a PNP load element, or to protect the memory with a die coat. In addition to requiring more complexity in the fabrication process, such techniques to improve alpha immunity often require trading off the density and speed-power performance of the memory cell.

In addition to alpha sensitivity, conventional bipolar memory circuits also suffer from write recovery delay, i.e. the recovery time necessary after a write operation before a read operation can be performed. That delay reduces the overall performance of a memory system. No circuit methods have been disclosed to date that address both the alpha-sensitivity and write recovery delay. Accordingly, a need remains for a better integrated memory cell.

SUMMARY OF THE INVENTION

One object of the invention is to improve alpha immunity in a bipolar or FET memory cell. Another object is to eliminate write-recovery delay in a bipolar memory cell. A further object is to achieve alpha immunity without materially sacrificing density, speed and power of an integrated memory circuit.

The present invention is a circuit design and method of operation for providing alpha immunity in integrated circuit memory cells while requiring only a fraction (on the order of 10%) of the storage node capacitance of a conventional memory cell. The invention can be used in all semiconductor memories but, when applied to any standard NPN bipolar process, the invention both provides alpha immunity and eliminates the write recovery delay of the bipolar memory cell.

The invention uses a pair of "slow, low-gain nodes" in the memory cell which are isolated from the storage nodes and prevents an alpha strike from changing the state of the memory. In addition, a current pulse technique is disclosed to rapidly change the state of the "slow" nodes during a write operation. Without this pulse technique, the "slow" nodes would degrade the write performance of the memory cell. Another feature of this novel technique, when applied to a bipolar memory, is that the devices do not saturate and therefore do not exhibit write recovery delay.

The conventional bipolar memory cell has a pair of transistors defining the state of the cell at their collectors which are subject to alpha hits. These collectors are referred to herein as the primary storage nodes. Similar techniques are used in MOS and other integrated circuit technologies which also include a pair of primary storage nodes.

The new method includes the following steps: First, providing a pair of secondary storage nodes in the cell that have a time constant such that the states of the secondary storage nodes are not affected by an alpha hit on the primary storage nodes. Second, during a write operation, duplicating the new states of the primary storage nodes on the secondary storage nodes. Third, coupling the secondary storage nodes to the primary storage nodes such that the primary storage nodes recover to the respective states of the secondary storage nodes following an alpha event. And, finally, during a write operation, speeding up the secondary storage nodes to avoid degrading the overall write performance of the cell.

These methods are equally applicable to bipolar and field effect transistor (FET) integrated circuit technologies. For example, in a bipolar memory cell, the cell includes a primary pair of common emitter connected bipolar transistors each having a collector terminal defining a primary storage node and a base terminal. The step of providing a secondary storage node includes: First, providing a pair of secondary common collector connected bipolar transistors each having a base terminal and an emitter terminal. Second, coupling the base terminals of the secondary transistors to the primary storage nodes; and finally, cross-coupling the emitter terminals of the secondary transistors to the base terminals of the primary transistors. In this way, the secondary transistors provide the cross-coupled feedback path necessary for a memory cell, while also isolating the primary storage transistors from each other to provide alpha immunity.

In an FET memory cell, the cell includes a primary pair of common source connected FET transistors each having a drain terminal defining a primary storage node and a gate terminal. The step of providing a secondary storage node includes: First, providing a pair of secondary common drain connected FET transistors each having a gate terminal and a source terminal Second, coupling the gate terminals of the secondary transistors to the primary storage nodes; and finally, cross-coupling the source terminals of the secondary transistors to the gate terminals of the primary transistors.

A standby current is established in the secondary transistors such that the secondary transistor output terminals have a time constant sufficiently long to maintain their logic state during an alpha event. In one example, the secondary standby current is about 1/10 th of the cell (i.e. the primary transistors) standby current.

Another aspect of the invention is a circuit design for an alpha immune memory cell. The alpha immune cell comprises a primary pair of transistors defining a primary pair of storage nodes; a secondary pair of transistors defining a secondary pair of storage nodes, connected to cross-couple the primary transistors; write circuitry coupled to the primary and secondary transistors for setting both the primary storage nodes and the secondary storage nodes to a predetermined state; and circuitry for controlling the secondary transistors to maintain the state of the secondary storage nodes in the predetermined state during an alpha event on the primary transistors.

The secondary storage nodes are coupled to the primary storage nodes so that the primary storage nodes recover to the state maintained by the secondary storage nodes after the cell incurs an alpha event. A particular advantage of the new cell is that the parasitic capacitances in the cell are sufficient to achieve alpha immunity. No explicit capacitance need be added to the cell.

The circuitry for controlling the secondary storage nodes includes a first current source, coupled to the secondary storage transistors, for providing a standby current through the secondary storage transistors such that the secondary storage nodes have a standby time constant greater than the duration of the alpha event; and a second current source, coupled to the secondary transistors, for establishing a write current flow through the secondary transistors during a write operation such that the secondary storage nodes have a write time constant that is shorter than the standby time constant.

A write boost circuit is preferably coupled to the write enable signal for establishing a write current through the secondary transistors that is greater than the bias current thereby increasing the operating speed of the secondary storage during a write operation. In an operative example, the write current is an order of magnitude greater than the standby current in the secondary transistors.

Another aspect of the invention is a memory array that includes a plurality of rows of memory cells, each of the cells including a pair of secondary transistors; a first current source coupled to the cells for biasing the secondary transistors to a predetermined standby current for standby operation; and a second current source coupled to the cells for biasing the secondary transistors in a selected one of the rows to a predetermined write current greater than the standby current for a write operation in the selected row.

Additionally, the array may include circuitry for distributing the write current in the selected row among the other rows so that the total current for biasing the secondary transistors in the array during a write operation is the same as the total current for biasing the secondary transistors in the array during standby operation.

In a preferred embodiment, the novel two-level biasing of the secondary transistors is implemented in a single current source per row, as follows: The array includes m rows of memory cells, each row including n memory cells, where m and n are non-zero integers. Each memory cell includes a pair of secondary transistors. Thus, m fixed current sources are provided, each current source coupled to the secondary transistors in a respective row of the array. Each current source thus provides a current of Ie×2n, where Ie is a standby bias current in each of the secondary transistors.

Each current source is coupled between a respective first node and circuit ground. M resistors of equal value are provided, each resistor coupled between a respective one of the first nodes and a common node. In this way, a voltage increase (generally arising from an assertion of the write enable signal) applied at a first one of the first nodes causes a write current to flow through the corresponding resistor from the first node to the common node. This distributes the write current among the other rows of the array.

Where the array includes only a few rows of cells, a dummy fixed current source may be provided, coupled to the common node, for providing a portion of the write current in the selected row in order to avoid debiasing the other rows during a write operation.

The foregoing and other objects, features and advantages of the invention will become more readily apparent from the following detailed description of a preferred embodiment which proceeds with reference to the drawings.

DETAILED DESCRIPTION OF A PREFERRED EMBODIMENT

Alpha Event Simulation of the Conventional Memory Cell

Figure 1A:
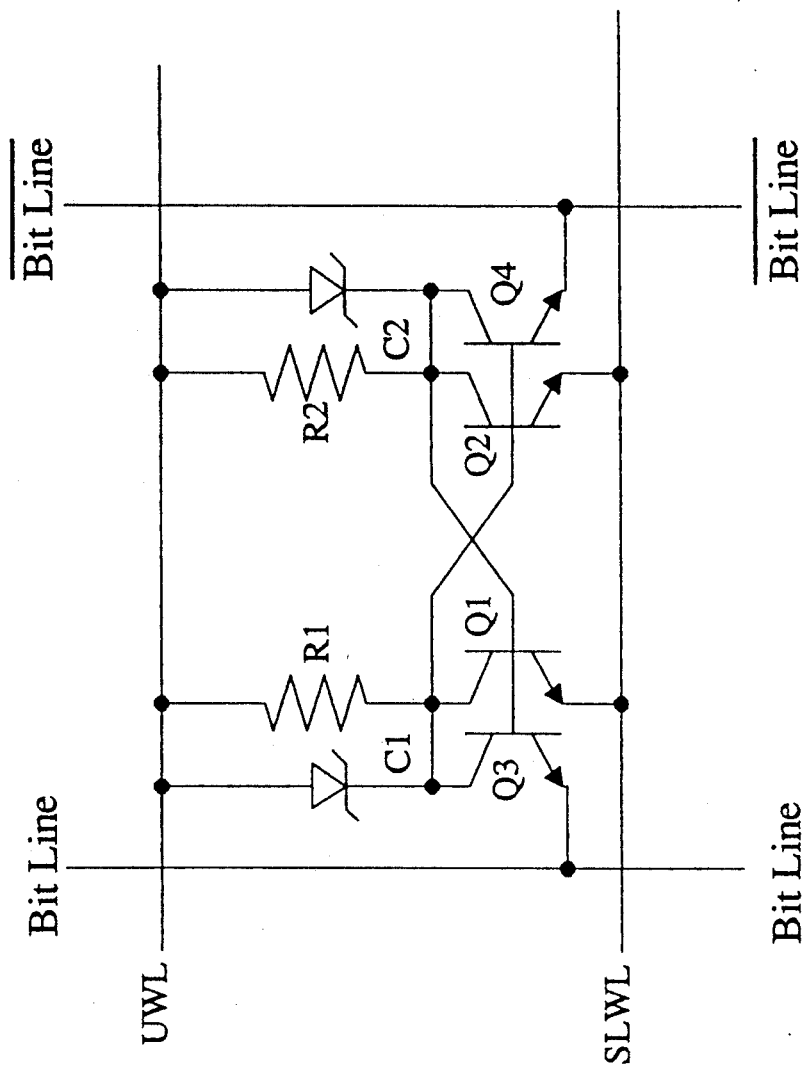
FIG. 1a is a schematic diagram of a conventional single-port bipolar memory cell that includes the storage elements of FIG. 1.
Figure 1:
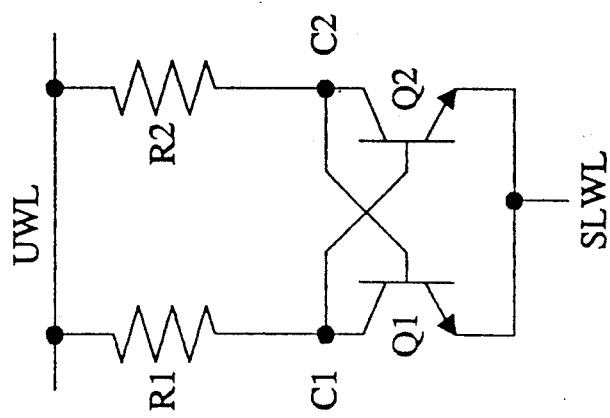
FIG. 1 is a schematic diagram of a conventional bipolar memory cell showing only the storage elements.
Figures 2, 2A:
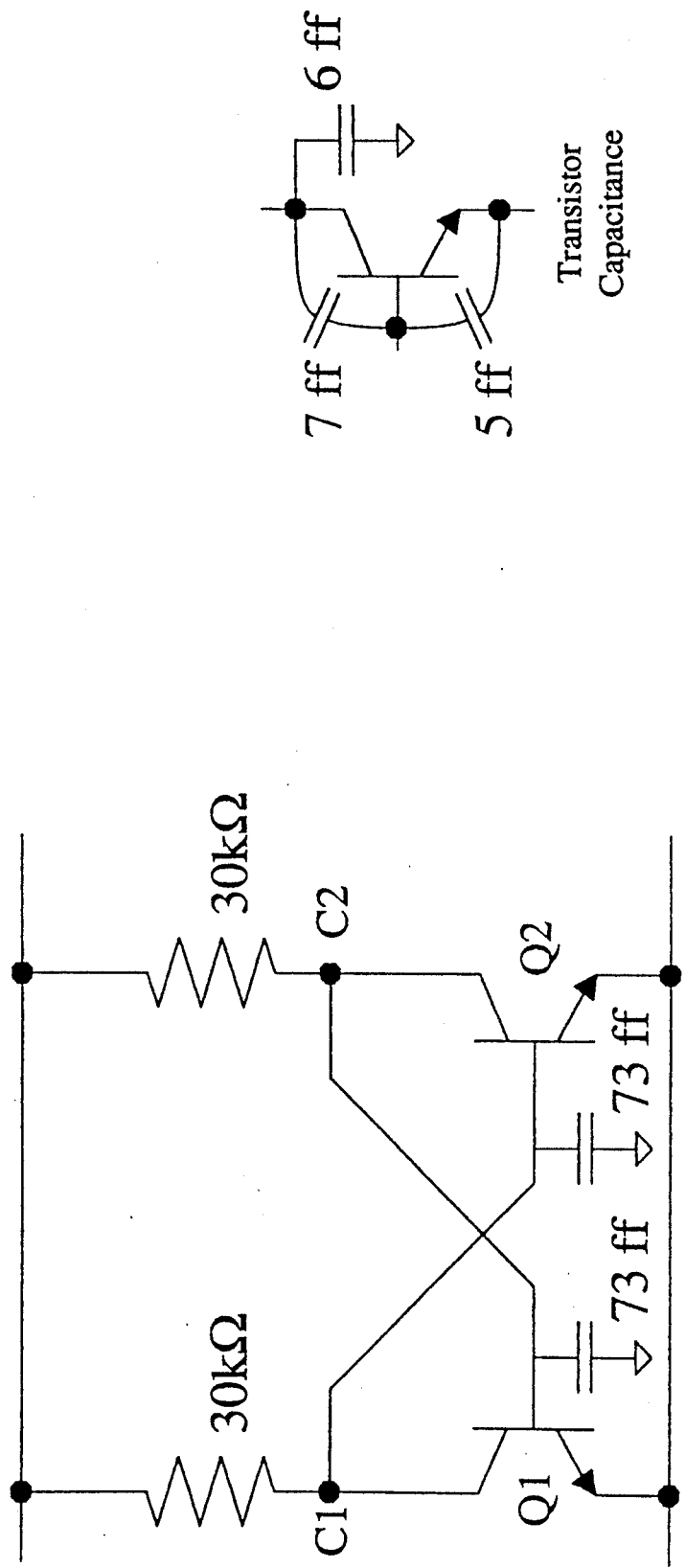
FIG. 2 is a simulation model of the conventional memory cell storage elements of FIG. 1 including additional capacitance added to each of the storage nodes for comparing the circuit's performance to that of an alpha immune memory cell.
FIG. 2a is a model of the parasitic transistor capacitances of transistors Q1, Q2 shown in FIG. 2.

Referring to FIG. 2, the present invention is best understood by first considering the effect of an alpha event on a typical conventional memory cell. In the conventional cell, switching transistors Q1, Q2 are cross-coupled, collector to base, to form a storage element. Nodes C1, C2 are referred to as the storage nodes. In the standby or steady state, the storage node voltages will be logic complements of each other. Q1 and Q2 are referred to herein as the primary transistors.

In order to compare the alpha sensitivity of the conventional memory cell to that of the alpha immune cell, described below, the total capacitance on the collector and base nodes of the new alpha immune cell have been distributed across the two nodes of the conventional cell. Thus, for the purpose of the comparison, both the new and conventional memory cell were simulated using, $$C_{total} = \sum_{n=C1,C2,B1,B2}(Cn) = 182\,ff$$

This required the addition of 73 ff of fixed capacitance to each of the storage nodes (C1 and C2) in the conventional memory cell. In the actual conventional cell, this additional capacitance would require increasing the cell area. Using this equivalent node capacitance technique, the conventional memory cell was simulated using the nodal capacitances shown in FIG. 2.

Figure 3:
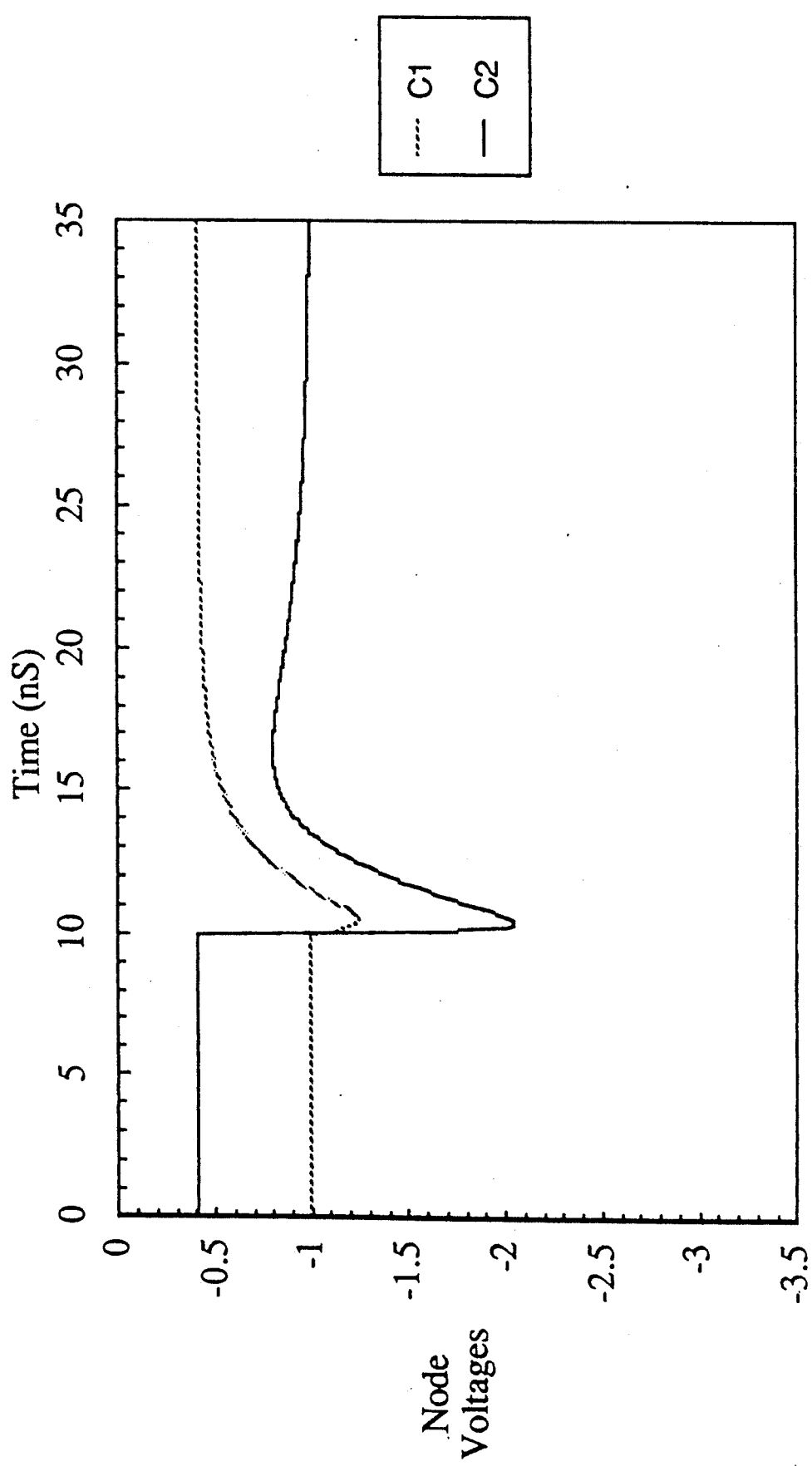
FIG. 3 is a simulation plot of node voltages versus time for a shallow angle alpha event impacting a conventional memory cell storage element as modeled in FIG. 2.

The result of the simulation, shown in FIG. 3, demonstrates that the conventional memory cell was unable to retain the stored state in the cell during the alpha hit. The effect of the alpha event appears to be as follows:
1) The "OFF" side collector node C2 takes a 1 mA alpha hit which pulls node C2 significantly lower than transistor Q2's base, putting Q2 into heavy saturation (saturated enough to turn on the base-collector junction).
2) As the collector C2 falls, the base voltage of transistor Q1 falls, turning off transistor Q1. With Q1 off, the voltages of node C1 and base of Q2 rise, turning on the opposite side of the cell (Q2) and changing the state of the cell.
3) The nodes finally reach their stable state with the opposite data stored in the cell at the RC time constant of the respective nodes.

In order to prevent the conventional memory cell from losing state due to an alpha hit, the total storage node capacitance must be increased from 182 ff to 962 ff. Under these conditions, the cell barely retains state and could result in an error if the cell were read within 50 nS of the alpha hit. In a practical design, and in order to obtain the same noise margin as the new memory cell, the node capacitance of the conventional memory cell would have to be increased to 2 pf (1 pf per storage node). This additional capacitance would have to be added to the memory cell at the expense of far greater area consumption when compared to the area of the additional devices required in the alpha immune memory cell, described next.

The Alpha Immune Memory Cell

Figure 4:
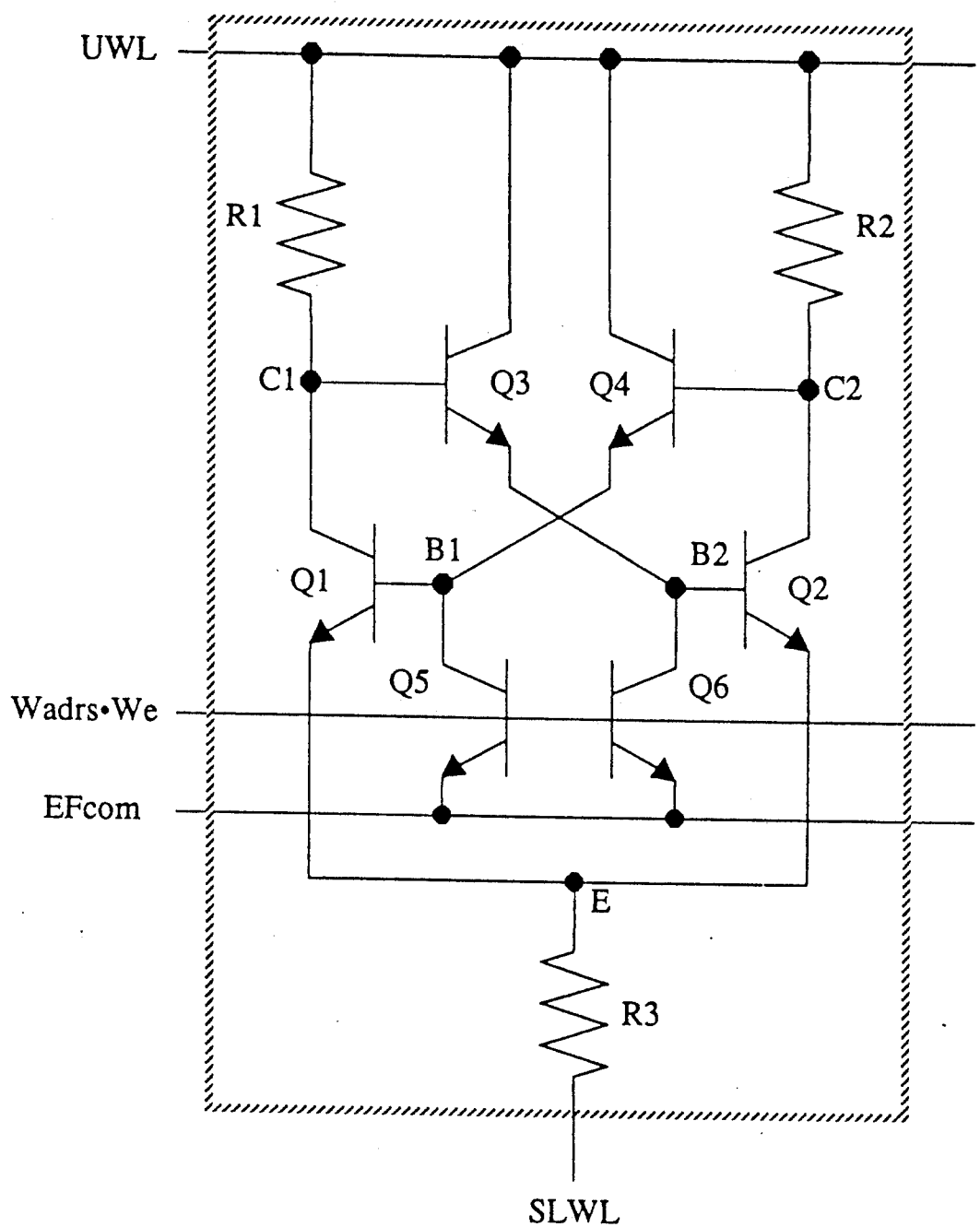
FIG. 4 is a schematic diagram of an alpha immune memory cell in accordance with the present invention, showing only the storage elements.

Referring now to FIG. 4, a simplified schematic diagram of an alpha immune memory cell according to the present invention is shown. The alpha immune cell in FIG. 4 contains only the storage elements; additional transistors are used to read and write the cell.

In FIG. 4, "UWL" is the conventional upper word line; "Wadrs.We" is the logical AND of the conventional write address signal and the write enable signal; and "EFcom" is a special emitter follower common path, further described below. Any of the standard techniques to read and write the cell can be used in the new memory cell without impacting its ability to provide alpha immunity.

Figure 4A:
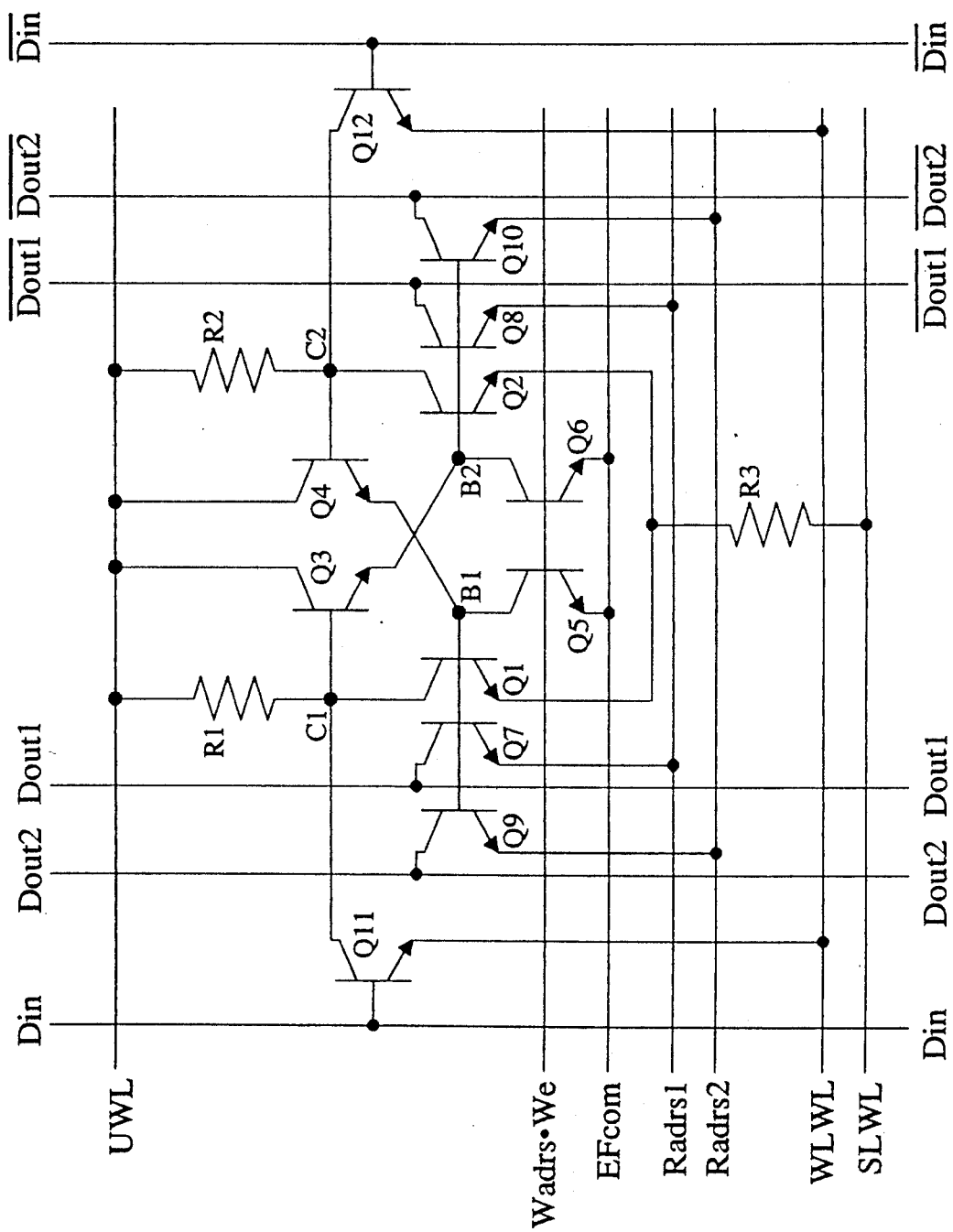
FIG. 4a is a schematic diagram of a three-port memory cell application of the alpha immune memory cell of FIG. 4.

An example of a practical application of the simplified cell of FIG. 4 is the three-port memory cell shown in FIG. 4a. FIG. 4a includes the basic cell of FIG. 4, i.e. transistors Q1–Q6 and resistors R1–R3; write transistors Q11, Q12; and read transistors Q7–Q10. The data lines and read address (Radrs) lines are conventional. "WLWL" is the write lower word line. The other signal lines are described with respect to FIG. 4.

Referring again to FIG. 4, transistors Q1 and Q2 are the "primary" transistors. The collector nodes C1, C2, referred to herein as the "primary storage nodes," are coupled to the UWL line by pull-up resistors R1, R2 respectively. The emitters of the primary transistors Q1, Q2 are connected together at a node E. Node E is coupled to "SLWL," the standby lower word line, via resistor R3.

Transistors Q3 and Q4 are the "secondary" transistors. The base terminals of the secondary transistors are connected to the primary storage nodes, and the emitters of the secondary transistors are cross-coupled to the base terminals of the primary transistors. Transistors Q5 and Q6 are current sources for biasing the secondary transistors. The bases of transistors Q5 and Q6 are coupled to the Wadrs"We line. The emitters of Q5 and Q6 are coupled to the EFcom line. It may be observed that the total emitter current in Q5, Q6, which is approximately equal to the total emitter current in Q3, Q4, is provided on a path EFcom.

The new memory cell uses transistors Q3, Q4, Q5 & Q6 to isolate and slow down the bases of conventional switching transistors Q1 and Q2. Transistors Q3 and Q4 are emitter followers which provide the cross-coupled feedback between the switching transistors Q1 and Q2. Transistors Q5 and Q6 bias the emitter followers and provide pull-down current on the base nodes of Q1, Q2.

Figure 6:
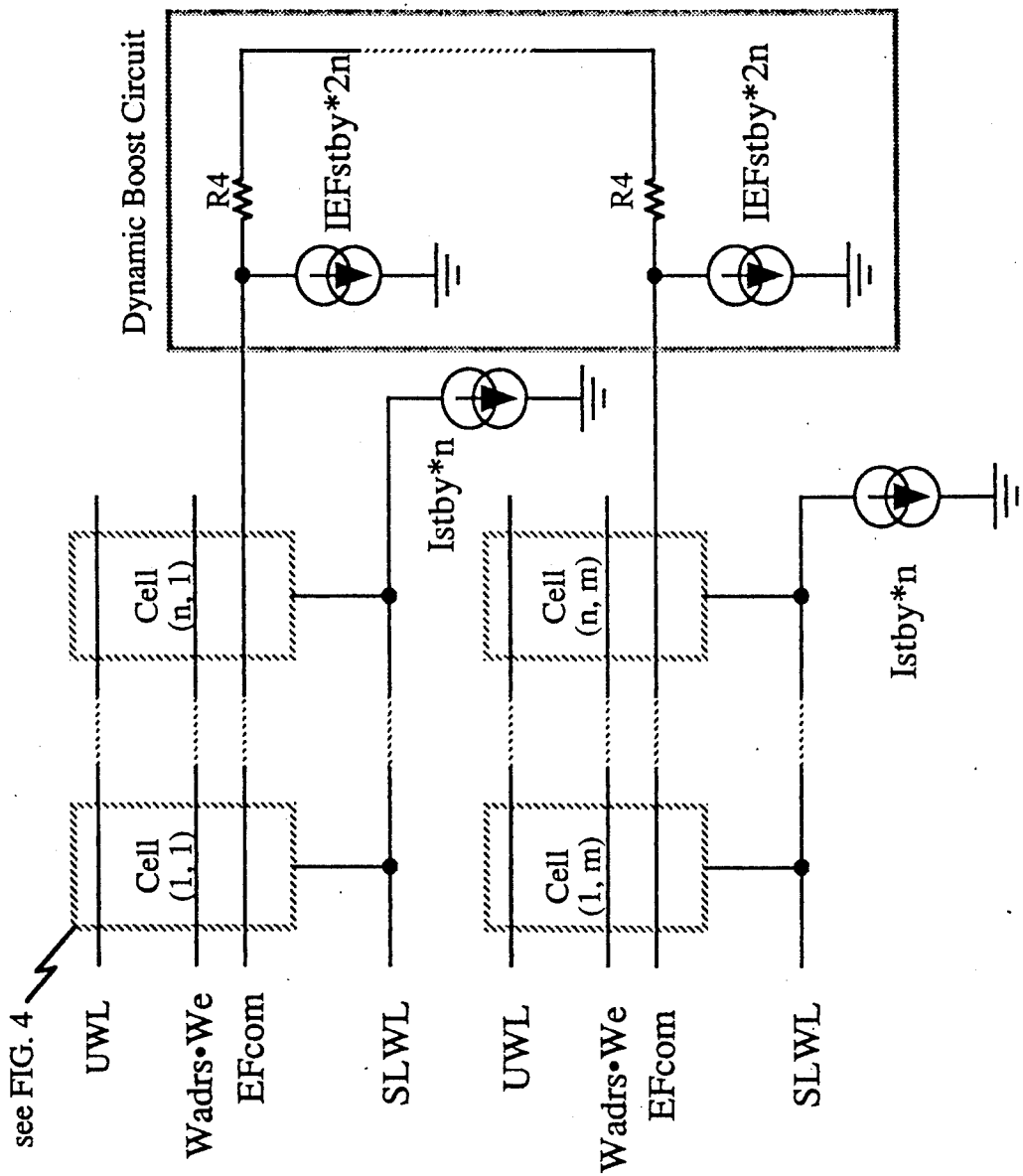
FIG. 6 is a diagram of a memory array that includes m rows of n memory cells and a dynamic write boost circuit in accordance with the present invention.

Path EFcom is common to all of the cells in a row, as shown in FIG. 6. The standby current in each of the emitter followers, Q3 and Q4, is IEFstby. Thus, the total emitter follower standby current for an entire row of n cells is IEFstby×2n, as indicated in FIG. 6.

During standby operation, IEFstby is set to give the emitter followers Q3, Q4 a very long falling edge rate as compared to the primary transistors. This is to make nodes B1, B2 slow enough to maintain their state during an alpha hit. As explained below regarding simulation results, these secondary storage nodes B1, B2 guide the primary storage nodes C1, C2 back to the pre-alpha hit state during recovery.

The falling edge rate of the emitter followers is determined by setting IEFstby as follows. Consider an emitter follower circuit that includes a current source and capacitive load on the emitter, as is the case for Q3 and Q4. The capacitive load is approximated by the capacitances shown in FIG. 5. Each of the Q3, Q4 emitters, for example the Q4 emitter (node B1), drives the capacitances shown in the following table:

TABLE I

| Secondary transistor emitter capacitances. |
|---|
| 6ff (Q5 collector - substrate) |
| 7ff (Q5 collector - base) |
| 5ff (Q1 base - emitter) |
| 7ff (Q1 collector - base) |
| 5ff (Q4 base - emitter) |
| 28ff (write transistors Q7, Q9 in FIG. 4a.) |
| 58ff total node B1 |

The base nodes of the secondary transistors, for example node C2, each has capacitances shown in the following table:

TABLE II

| Secondary transistor base capacitances. |
|---|
| 7ff (Q4 collector - base) |
| 6ff (Q2 collector - substrate) |
| 20ff (write transistor Q12 in FIG. 4a) |
| 33ff total node C2 |

The total capacitance is 58+33=91 ff per secondary transistor or 182 ff total for both secondary storage nodes.

When an alpha hit strikes the off-side primary storage node, for example node C2, a collector current is induced in Q2 which pulls the C2 node voltage sharply downward. Node C2 is coupled to the base terminal of secondary transistor Q4. When the Q4 base voltage drops, the emitter voltage will ramp down roughly linearly as the emitter capacitance is discharged through IEFstby, according to the relationship IEFstby=Ctotal×dv/dt. The Q4 emitter, node B1, ramps down relatively slowly, because IEFstby is small. During standby operation, the Q5, Q6 current sources are biased at a fraction of the standby current in devices Q1 and Q2. This results in a very long falling delay on the base nodes of the switching pair Q1 and Q2.

Resistor R3 is provided to reduce the gain of the primary transistors Q1, Q2. To illustrate, in an operative example of an alpha immune cell, shown in FIG. 4a and modeled in FIG. 5, the voltage gain of nodes B1 to C1, without resistor R3, is on the order of 20 at room temperature. This figure is for resistor R1, R2 values of 30 kohms and standby current Istby of 20 $\mu$amps, for a voltage swing at C1 of 600 mV. With the addition of R3=10 kohms, the gain is reduced by approximately an order of magnitude to about 2.5. The effect is seen in the simulation plots of FIGS. 7, 8. The voltage fall at C2 induced by an alpha hit pulls node B1 down, but only by a few hundred millivolts. The resulting voltage rise at node C1, and hence at node B2 (a Vbe drop below node C1) is insufficient to turn transistor Q2 on, so the primary storage node recovers to the pre-alpha hit state, i.e. with transistor Q2 off. Resistor R3 is unnecessary in most FET circuits as the voltage gain is generally lower than in the bipolar circuit.

In addition to creating the slow storage nodes, devices Q3, Q4, Q5, and Q6 also prevent transistors Q1 and Q2 from saturating. The use of non-saturating devices prevents storing charge in the bases of transistors Q1 and Q2 and therefore eliminates the write recovery delay of conventional bipolar memory circuits. Using the techniques disclosed above, the memory cell can be read immediately following a write operation without concern for write recovery time within the cell.

Simulation of the Alpha Immune Memory Cell

To illustrate operation of the alpha immune cell of FIG. 4, simulation results for two types of alpha events impacting on the storage node of the immune cell are discussed next. Note that during the simulations the standby-lower-word-line (SLWL) is held at an AC ground by the other memory cells on the row of the memory array (see FIG. 6).

Figure 7:
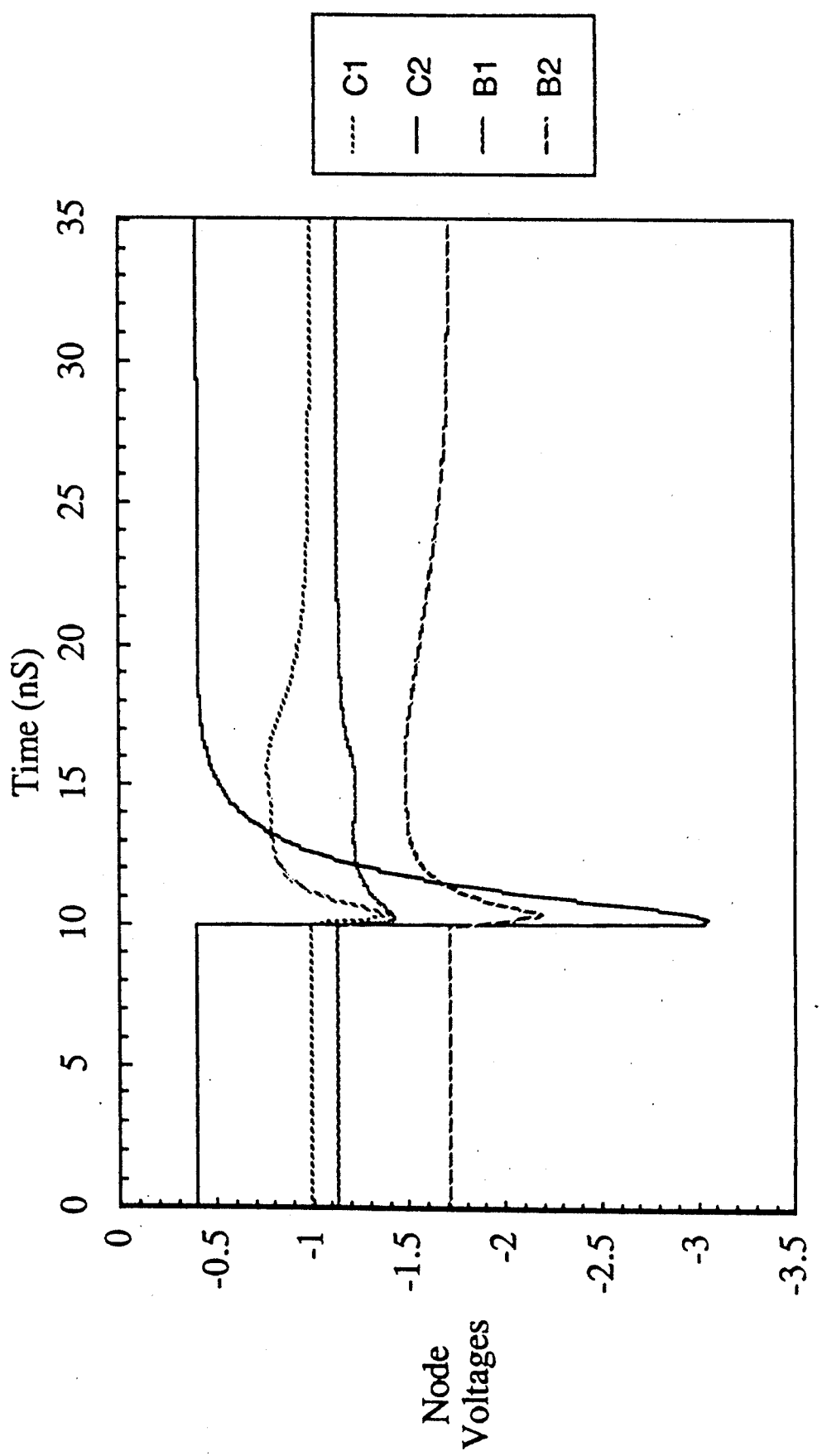
FIG. 7 is a simulation plot of node voltages versus time for a shallow angle alpha event impacting the alpha immune memory cell as modeled in FIG. 5.

Referring first to FIG. 7, a shallow angle alpha hit generates an instantaneous current pulse in the collector of the switching transistor at the off side of the memory cell (assumed here to be node C2). The case of a shallow angle alpha hitting the silicon generates the largest current due to the creation of electron-hole pairs in the depletion region of the transistor where all of the generated carriers induce current in the device. The simulation plot shows the following:

1) The "OFF" side collector node C2 takes a 1 mA alpha hit which pulls node C2 to a voltage significantly lower than transistor Q2's base, putting Q2 into heavy saturation (saturated enough to substantially turn on the base-collector junction). As voltage at the collector node C2 falls, the voltage at base node B2 of transistor Q2 follows. This in turn causes emitter follower Q3 to turn on heavily and both pull and capacitively couple node C1 downward.

2) Due to the base-emitter junction capacitances of transistor Q4, node B1 is coupled downward turning off transistor Q1.

3) At this point the alpha hit ends and releases node C2. The voltage at node C2 rises rapidly due to resistor R2 and the heavily turned on emitter follower Q3.

4) Once the alpha hit releases C2, the voltage at node C1 begins to rise, pulled up by R1 because Q1 has been turned off.

5) As node C1's voltage rises, node B2 follows since it is pulled up by the emitter follower transistor Q3. It does not, however, charge sufficiently high enough to turn on transistor Q2.

6) Node B1, appears to 'hang' as it balances its small pull-down current in Q5 with the base-emitter capacitor of transistor Q4 coupling to pull it up. It does however pull up just enough to keep node C1 from rising any farther by turning transistor Q1 back on which eventually causes node C1 to fall. The ability of transistor Q1 to turn back on is aided tremendously by the presence of the drop across resistor R3 (200 mV in normal operation). This degeneration resistor reduces the gain of Q1 so that it does not completely turn off with a slight decrease in the base node B1.

7) As node C2 makes its way back to its original level (transistor Q2 stays off), node B1 follows turning transistor Q1 back on fully. As transistor Q1 pulls node C1 back down, base node B2 follows, but due to the small pull-down current in transistor Q6, it takes a little longer to achieve its nominal low level.

In summary, the alpha immune memory cell has regained its stable state and the alpha hit has not introduced a soft error failure.

Vertical Incidence Alpha Event Simulation of the New Memory Cell

Figure 8:
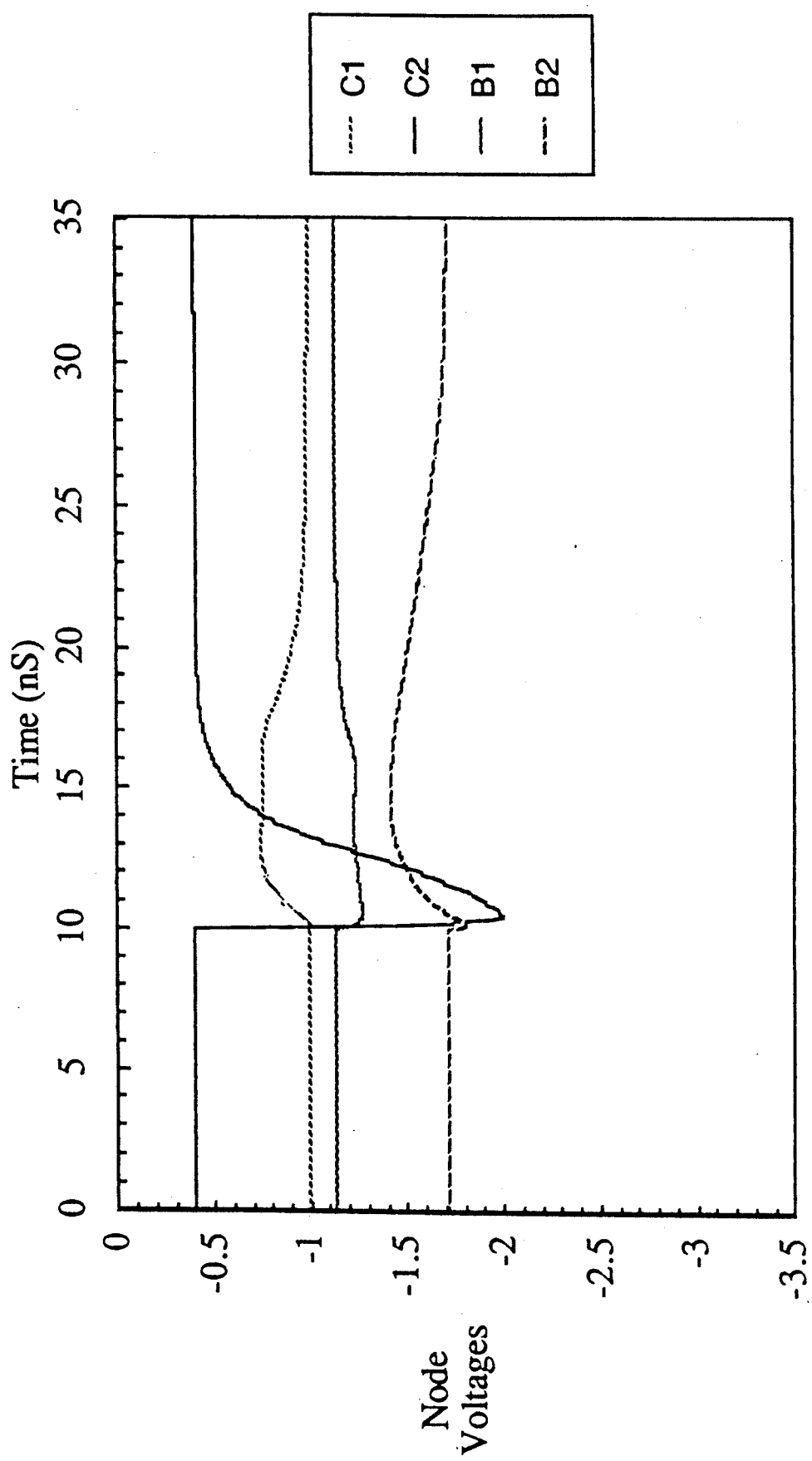
FIG. 8 is a simulation plot of node voltages versus time for a vertical incidence alpha event impacting the alpha immune memory cell as modeled in FIG. 5.

Referring now to FIG. 8, it may be observed that when an alpha particle strikes the silicon at normal incidence (straight down), the induced current has a much lower peak value but lasts for considerably longer. To ensure the alpha immunity of a memory cell, both shallow and vertical incidence alpha hits must not disturb the state of the cell. The simulation plot shows:

1) The "OFF" side collector node C2 takes a 300 uA alpha hit which pulls the voltage of node C2 slightly lower than transistor Q2's base, putting transistor Q2 into soft saturation (not saturated enough to substantially turn on the base-collector junction).

2) Node B2 is coupled slightly lower through the base-collector capacitor of transistor Q2 and node B1 is also coupled downward by the base-emitter capacitor of Q4. This decrease in the base voltage of transistor Q1 shuts off transistor Q1 which then allows node C1 to rise.

3) As the voltage at node C1 rises, that of node B2 follows since it is pulled up by the emitter follower transistor Q3. It does not, however, charge sufficiently high enough to turn on transistor Q2.

4) Node B1 again 'hangs' as it balances its small pull-down current with the base-emitter capacitor of transistor Q4 coupling to pull it up. But as in the case of the shallow angle alpha, it pulls up enough to keep the voltage at node C1 from rising any farther by turning transistor Q1 back on. This eventually causes the voltage at node C1 to fall back to its original level.

5) As node C1 returns to its low level, base node B2 will attempt to follow, but due to its small pull down current it takes a little longer to achieve its nominal low level. As in the case of a shallow angle alpha, it can be concluded that the memory cell has regained its stable state and the alpha hit has not introduced a soft error failure.

Figures 5, 5A:
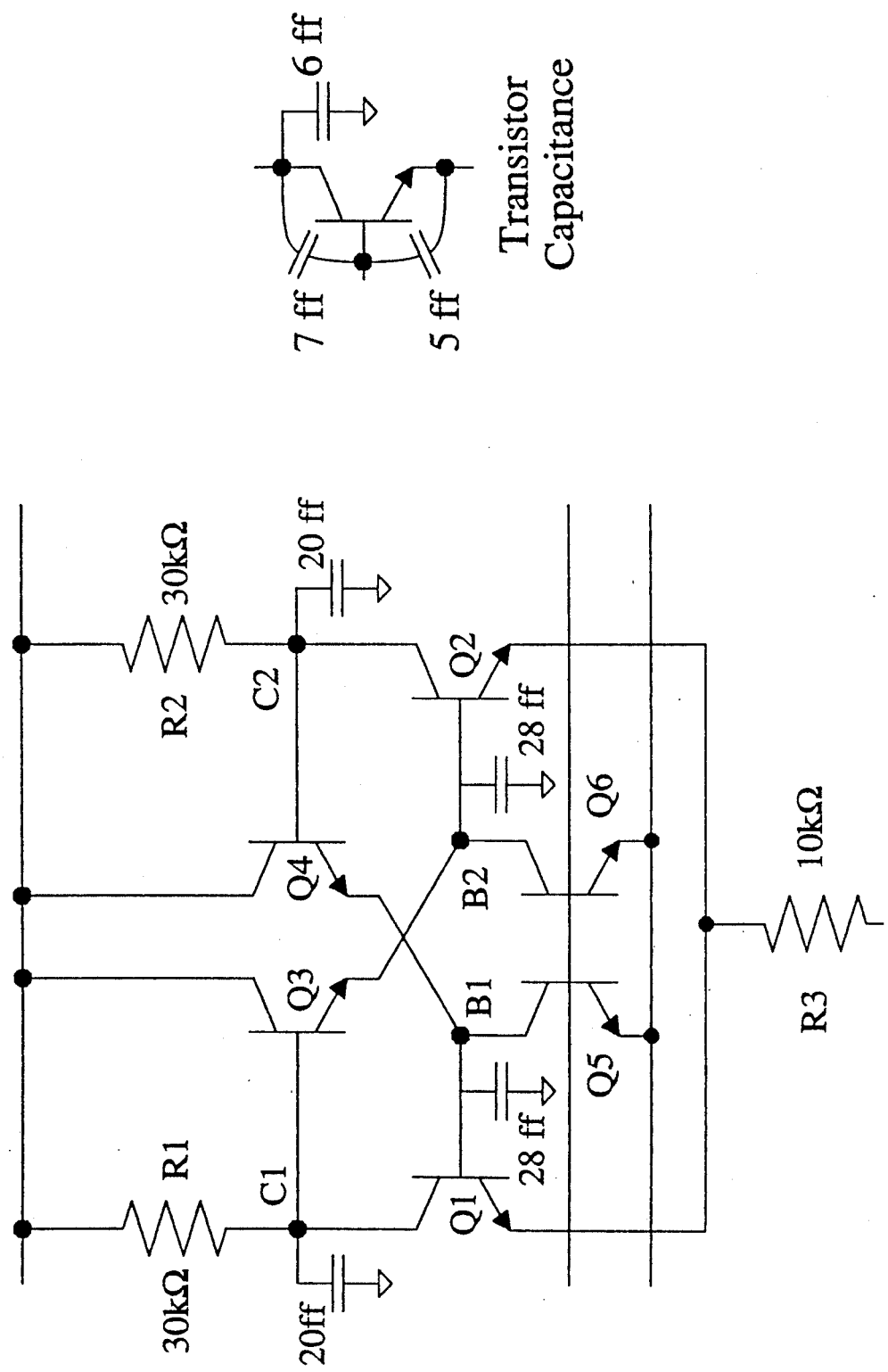
FIG. 5 is a simulation model of the alpha immune memory cell of FIG. 4.
FIG. 5a is a model of the parasitic capacitance of the transistors of FIG. 5.

Additional simulations indicate that this new memory cell is immune to alpha hits across voltage, over temperature, and on any node in the cell. The actual capacitance used on the nodes in these simulations is shown in FIG. 5. The total capacitance on the nodes, C1, C2, B1, and B2 is 182 ff.

Writing the Alpha Immune Memory Cell:

The Dynamic Write Boost Circuitry

FIG. 6 depicts an n×m array of cells as shown in FIG. 4a, omitting datas lines for clarity. To rapidly write the new cell, the slow secondary nodes must have the time constant reduced substantially during a write operation. A dynamic boost circuit is disclosed in FIG. 6 which both rapidly writes the cell and takes very little additional circuitry.

Referring now to FIG. 6, the emitter follower standby current IEFstby×2n distributes evenly across each respective row in the memory array. All of the emitter followers connected between the Wadrs.We and EFcom lines equally share the row's current. The IEFstby current is set at a fraction of the cell standby current (Istby) to establish the long time constant of the secondary storage nodes in the memory cell. The network of resistors R4 are balanced, and during standby operation, carry no current. This sets up an AC ground on the resistor common node.

During a write operation, the base voltages of the emitter followers (Wadrs.We) are raised on the row being written. The increase in the potential of the EFcom line on the selected row causes a voltage drop across the single R4 resistor in that row because of the AC ground on the resistor common line. This boosts the emitter follower current from IEFstby to a value (Iwrite) set by the value of R4 as follows:

$$R4 = \frac{Swing(Wadrs \cdot We) - [(kT/q)*\ln(Iwrite/IEFstby)]}{2*n*Iwrite}$$

where n is the number of cells in the row. The boost current is distributed over all of the remaining (unselected) rows. When the number of rows (m) in the memory array is large, the emitter followers on the unselected rows have a negligible reduction in current when a row is being written. When (m) is small, this circuit technique can be employed by incorporating dummy IEFstby current sources to prevent significant debiasing of emitter followers on unselected rows.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A method of providing alpha immunity in a memory cell having a pair of primary storage nodes, the method comprising the steps of:
   providing a pair of secondary storage nodes in the cell, the secondary storage nodes having a standby time constant such that the state of the secondary storage nodes is not affected by an alpha hit on the primary storage nodes;
   during a write operation, writing new data directly into both of the primary storage nodes and both of the secondary storage nodes;
   coupling the secondary storage nodes to the primary storage nodes such that the primary storage nodes recover to the states of the respective secondary storage nodes following an alpha event; and
   reducing the time constant of both secondary storage nodes during a write operation to maintain the overall write performance of the cell.

2. A method according to claim 1, the memory cell including a primary pair of bipolar transistors each having a collector terminal defining a respective one of the primary storage nodes and a base terminal, wherein the step of providing a pair of secondary storage nodes includes:
   providing a secondary pair of bipolar transistors each having a base terminal and an emitter terminal;
   connecting the base terminals of the secondary transistors to the primary storage nodes;
   cross-coupling the emitter terminals of the secondary transistors to the base terminals of the primary transistors to form the secondary nodes; and
   coupling the secondary transistor emitters to a current source for biasing the secondary transistors independently of the primary transistors.

3. A method according to claim 2 including the step of biasing both secondary transistors to a predetermined standby emitter current such that the secondary storage nodes have a time constant sufficiently long to maintain their logic state during an alpha event.

4. A method according to claim 3, further comprising:
   during a write operation, boosting the emitter current in both secondary transistors to a predetermined write current greater than the standby emitter current.

5. A method according to claim 4, wherein the primary transistors have a predetermined voltage gain, including the step of reducing the voltage gain of the primary transistors relative to the predetermined voltage gain to enhance immunity to alpha events.

6. A method according to claim 3 wherein said biasing step includes:
   providing a pair of bias current sources, each connected to a respective one of the secondary transistor emitter terminals to provide emitter current; and
   coupling the bias current sources together to receive a write enable signal.

7. An alpha immune memory cell comprising:
   a primary pair of transistors defining a pair of primary storage nodes;
   a secondary pair of transistors defining a secondary pair of storage nodes, connected to cross-couple the primary transistors;

means for controlling the secondary transistors to maintain the state of the secondary storage nodes in a predetermined state during an alpha event on the primary transistors; and means for coupling the secondary storage nodes to the primary storage nodes so that the primary storage nodes recover to the state maintained by the secondary storage nodes after the cell incurs an alpha event.

8. An alpha immune memory cell according to claim 7, the primary storage nodes and the secondary storage nodes having parasitic capacitances, wherein:

the means for controlling the secondary transistors to maintain the state of the secondary storage nodes includes a standby current source coupled to the secondary transistors for biasing each of the secondary transistors to a selected standby current such that the standby current in combination with the parasitic capacitances define a time constant of each secondary node sufficient to maintain the state of the secondary nodes during an alpha hit on each corresponding primary node.

9. An alpha immune memory cell according to claim 7, including write boost means coupled to the secondary transistors and responsive to a write enable signal for increasing the operating speed of the secondary transistors during a write operation.

10. An alpha immune memory cell according to claim 8 wherein the controlling means includes:

a first current source, coupled to the secondary transistors, for providing a standby current in the secondary transistors such that the secondary storage nodes have a standby time constant greater than an expected duration of the alpha event; and a second current source, coupled to the secondary transistors, for establishing a write current in the secondary transistors during a write operation such that the secondary storage nodes have a write time constant that is shorter than the standby time constant.

11. An alpha immune memory cell according to claim 10 wherein the write current is approximately an order of magnitude greater than the standby current.

12. An alpha immune memory cell according to claim 7, the primary transistors having a selectable voltage gain, including means for selecting the voltage gain of the primary transistors so as to reduce the effect of an alpha event on the cell.

13. A method of providing alpha immunity in a memory cell having a pair of primary transistors defining primary storage nodes, write circuitry coupled to the primary storage nodes, and read circuitry, the primary transistors, write circuitry and read circuitry all having parasitic capacitances, the method comprising the steps of:

providing a pair of secondary transistors having parasitic capacitances, cross-coupled between the primary storage nodes and the read circuitry so as to define a pair of secondary storage nodes;

summing the primary transistor parasitic capacitances, the secondary transistor parasitic capacitances, the read circuitry parasitic capacitances and the write circuitry parasitic capacitances to determine a total secondary parasitic capacitance; and biasing the pair of secondary transistors to a standby current such that the standby current in combination with the total secondary parasitic capacitance establish a time constant for the secondary storage nodes such that the state of the secondary storage nodes is not affected by an alpha hit on the primary storage nodes, whereby no explicit capacitance need be added to the cell to provide alpha immunity.

14. A dynamic write boost circuit for a memory cell having a primary pair of transistors and a secondary pair of transistors, the boost circuit comprising:

bias means for biasing the secondary transistors to a selected one of a bias current for standby operation and a write current for a write operation;

the bias means being responsive to a write enable signal input such that the secondary transistors are biased to the write current when the write enable signal is asserted and are biased to the bias current when the write enable signal is not asserted.

15. A memory array comprising: a plurality of rows of memory cells, each of the cells including a pair of primary transistors and a pair of secondary transistors cross-coupled to the primary transistors;

first bias means coupled to the cells for biasing the secondary transistors to a predetermined standby current for standby operation; and second bias means coupled to the cells for biasing the secondary transistors in a selected one of the rows to a predetermined write current greater than the secondary transistor standby current for a write operation in the selected row.

16. A memory array according to claim 15 including means for distributing the excess of the write current over the standby current in the selected row among the non-selected rows so that the total current for biasing the secondary transistors in the array during a write operation is the same as the total current for biasing the secondary transistors in the array during standby operation.

17. A memory array comprising:

m rows of memory cells, each row including n memory cells, where m and n are integers greater than or equal to one;

each memory cell including a pair of primary transistors and a pair of secondary transistors cross-coupled to the primary transistors;

m fixed current sources, each current source coupled to the secondary transistors in a respective row of the array at a respective first node and arranged to provide a current of $Ie \times 2n$, where Ie is a standby bias current in each of the secondary transistors;

m resistors of equal value, each resistor coupled between a respective one of the first nodes and a common node, whereby a voltage increase applied at a first one of the first nodes causes a write current to flow across the corresponding resistor from the first node to the common node, thereby distributing the write current among the other rows of the array.

18. A memory array according to claim 17 including a dummy fixed current source coupled to the common node for providing a portion of the write current in the selected row to avoid debiasing the other rows during a write operation.

19. A method according to claim 2 including operating the primary bipolar transistors and the secondary bipolar transistors without saturation to prevent storing charge in the base regions of the primary transistors thereby eliminating write recovery delay of the memory cell.

20. A method according to claim 5, wherein said reducing the voltage gain of the primary transistors includes:

connecting the primary transistor emitter terminals together to form a common node for coupling the memory cell to a standby lower word line; and providing a degeneration resistor between the common node and the standby lower word line to reduce the voltage gain of the primary transistors to enhance immunity to alpha events.

21. A method according to claim 13 including:

connecting the cell to a write enable line to receive a write enable signal; and responsive to the write enable signal, boosting the current in the secondary transistors to a write current such that the write current in combination with the total secondary parasitic capacitance provide a time constant of the secondary storage nodes comparable to a time constant of the primary storage nodes to maintain the write performance of the cell.

\* \* \* \* \*

UNITED STATES PATENT AND TRADEMARK OFFICE
CERTIFICATE OF CORRECTION

PATENT NO. : 5,043,939
DATED : August 27, 1991
INVENTOR(S) : Slamowitz et al.

It is certified that error appears in the above-identified patent and that said Letters Patent is hereby corrected as shown below:

On the title page, Item [57], line 3, change "form a flow" to --form a slow--;

at [57], line 9, change "ahcieved" to --achieved--;

Column 1     line 10, change "memories An" to --memories. An--;

Column 2     line 44, change "terminal Second," to --terminal. Second,--;

Column 6     line 13, change "Wadrs"We" to --Wadrs. We--

Column 11     line 29, change "8 wherein the" to --7 wherein the--.

Signed and Sealed this

Sixth Day of April, 1993

Attest:

STEPHEN G. KUNIN

Attesting Officer     Acting Commissioner of Patents and Trademarks